United States Patent
Yang (10) Patent No.: US 7,141,870 B2
(45) Date of Patent: Nov. 28, 2006

(54) APPARATUS FOR MICRO-ELECTRO MECHANICAL SYSTEM PACKAGE

(75) Inventor: Xiao Yang, Sunnyvale, CA (US)

(73) Assignee: Miradia Inc., Sunnyvale, CA (US)

( * ) Notice: Subject to any disclaimer, the term of this patent is extended or adjusted under 35 U.S.C. 154(b) by 112 days.

(21) Appl. No.: 10/902,659

(22) Filed: Jul. 28, 2004

(65) Prior Publication Data

US 2006/0024919 A1   Feb. 2, 2006

(51) Int. Cl.
*H01L 23/495* (2006.01)
*H01L 21/30* (2006.01)

(52) U.S. Cl. ...................... 257/676; 438/455

(58) Field of Classification Search ............... 438/110, 438/127, 455–462; 156/299; 257/676, 680, 257/704, 710, 779–782
See application file for complete search history.

(56) References Cited

U.S. PATENT DOCUMENTS 6,396,711 B1 * 5/2002 Degani et al. .............. 361/760

2001/0022382 A1 * 9/2001 Shook ........................ 257/415
2003/0025984 A1 * 2/2003 Gudeman et al. ........... 359/291

* cited by examiner

*Primary Examiner*—Calvin Lee
(74) *Attorney, Agent, or Firm*—Townsend and Townsend and Crew LLP (57) ABSTRACT

A method of manufacturing a multi-substrate semiconductor package. The method includes providing a first substrate with a plurality of first dies present thereon and forming a plurality of electrical contacts on an upper surface of a lateral extension portion of at least one of the plurality of first dies on the first substrate. The method also includes providing a second substrate, the second substrate comprising a plurality of second dies, at least one of the plurality of second dies comprising an interconnect region. Further, the method includes forming a sandwich structure by bonding the second substrate to an upper surface of the first substrate to form an intermediate level within the sandwich structure and separating the dies. The method also includes coupling an electrically conductive structure through the interconnect region of the one second dies to the lateral extension portion of the one first die.

4 Claims, 10 Drawing Sheets

APPARATUS FOR MICRO-ELECTRO MECHANICAL SYSTEM PACKAGE

BACKGROUND OF THE INVENTION

This present invention relates generally to manufacturing objects. More particularly, the invention provides a method and apparatus for packaging a micro-electromechanical system (MEMS). Merely by way of example, the invention has been applied to a MEMS with a transparent glass cover bonded to a ball grid array with a reduced lateral separation between the transparent glass cover and the ball grid array. The method and apparatus can be applied to display technology as well as, for example, charge coupled display camera arrays, and infrared arrays.

Figure 1:
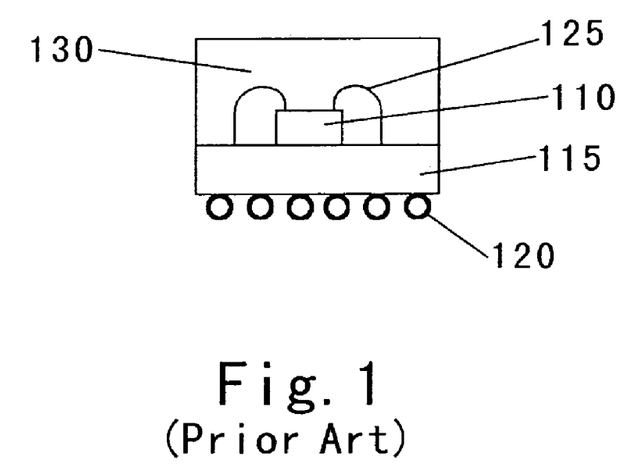
FIG. 1 is a simplified diagram of a conventional silicon integrated circuit package.

The packaging of silicon integrated circuits has reached a high level of maturity. FIG. 1 illustrates a simplified diagram of a conventional silicon integrated circuit package. The silicon integrated circuit die 110 is mounted on a submount 115 featuring a ball grid array 120. Wire bonds 125 are attached to the silicon die 110 to provide electrical connection to the submount 115. Typically, the silicon die 110 and the wire bonds 125 are encapsulated using a plastic encapsulant 130. The resulting package is robust and inexpensive.

The package illustrated in FIG. 1 presents several drawbacks in applications that often require more than electrical operation of the silicon integrated circuit. An example of such an application is optical reflection off an array of micro-mirrors or other MEMS. For example, these applications typically require the ability to illuminate the top of the silicon integrated circuit with optical energy and subsequently reflect the optical energy off the top of the silicon integrated circuit with high efficiency. The optical properties of the plastic encapsulant, including lack of transparency, non-uniformity of the index of refraction, and surface roughness make these packages unsuitable for this application. Additionally, many MEMS often require an open space above the surface of the silicon integrated circuit to enable the micro-electro-mechanical structures to move in the direction parallel to the plane of the MEMS as well as in the direction perpendicular to the plane of the MEMS. The physical contact that the plastic encapsulant makes with the surface of the integrated circuit, therefore, make this package unsuitable for many MEMS applications.

Figure 2:
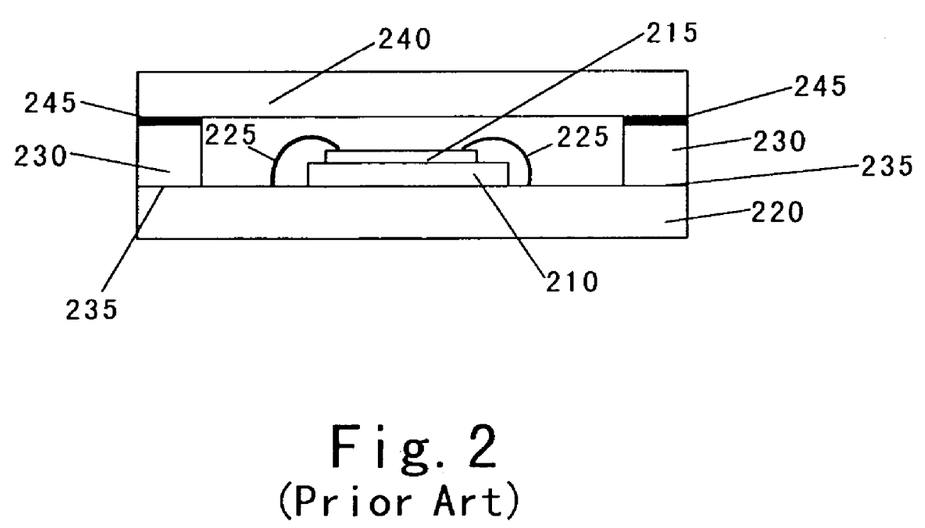
FIG. 2 is a simplified diagram of a conventional hermetically sealed transparent integrated circuit package.

In order to solve some of these technical issues, techniques have been developed to package MEMS in hermetically sealed packages with transparent covers that allow for transmission of optical energy through the cover and reflection off the MEMS components. An example of a MEMS packaged in a hermetically sealed package with a transparent cover is illustrated in FIG. 2. As shown, a silicon MEMS die 210 featuring a micro-mirror array 215 is mounted on a submount 220. The die is attached to the submount using die attach procedures that are compatible with hermetically sealed packaging designs well known to those skilled in the art. Wire bonds 225 are attached to the silicon die and the submount as with the package illustrated in FIG. 1.

To provide an open space above the micro-mirror array 215, a solid standoff 230 is typically placed near the outer edge of the submount. This standoff is typically shaped as a square annulus and fabricated from covar or other suitable materials. The standoff is often brazed onto the submount at contact points 235. A glass cover plate 240 is typically brazed onto the top of the standoff at contact points 245 to seal the package. Despite progress in packaging MEMS in hermetically sealed packages, there are still limitations. For example, the conventional MEMS package is often expensive and difficult to manufacture. Additionally, the conventional MEMS package often requires a certain amount of chip real estate, which is expensive and leads to larger package designs. These and other limitations are described throughout the present specification and more particularly below.

From the above, there is a need for an improved package for multilayered integrated circuit/MEMS structures.

BRIEF SUMMARY OF THE INVENTION

This present invention relates generally to manufacturing objects. More particularly, the invention provides a method and apparatus for packaging a MEMS. Merely by way of example, the invention has been applied to a MEMS with a transparent glass cover bonded to a ball grid array with a reduced lateral separation between the transparent glass cover and the ball grid array. The method and apparatus can be applied to display technology as well as, for example, charge coupled display camera arrays, and infrared arrays.

In a specific embodiment according to the present invention, a method for manufacturing a multi-substrate semiconductor package is provided. The method comprises providing a first substrate with a plurality of first dies present thereon and forming a plurality of electrical contacts on an upper surface of a lateral extension portion of at least one of the plurality of first dies on the first substrate. The method also comprises providing a second substrate, the second substrate comprising a plurality of second dies, at least one of the plurality of second dies comprising an interconnect region and forming a sandwich structure by bonding the second substrate to an upper surface of the first substrate such that the interconnect region of at least one of the second dies is overlying the lateral extension portion of at least one of the first dies to form an intermediate level within the sandwich structure formed by at least the first substrate and the second substrate. The method further comprises separating at least the one second die including the interconnect region and the bonded first die including the lateral region from the sandwich structure and coupling an electrically conductive structure through the interconnect region of the one second dies to the lateral extension portion of the one first die, thereby electrically coupling the electrically conductive structure to the lateral extension portion within a portion of the intermediate level.

In an alternative embodiment, the invention provides a method of packaging a micro-electromechanical system. The method comprises providing a plurality of micro-electromechanical system components located on an upper surface of a first substrate, wherein the plurality of micro-electromechanical system components comprise a plurality of electrically activated of micro-electromechanical devices and a plurality of electrical contacts and providing a second substrate having a plurality of transparent regions. The method also comprises aligning the plurality of micro-electromechanical devices with the plurality of transparent regions, wafer bonding the second substrate to the upper surface of the first substrate to form a multi-substrate semiconductor structure, and dicing the multi-substrate semiconductor structure to form a separated micro-electromechanical chip comprising at least one of the plurality of transparent regions, wherein the dicing step exposes the plurality of electrical contacts. The method further comprises providing a ceramic ball grid array structure in the shape of an annulus with an inner perimeter of larger size than an outer perimeter of the at least one of the plurality of transparent regions and bonding the separated micro-electromechanical chip to the ceramic ball grid array structure, wherein a lateral spacing between the outer perimeter of the at least one of the plurality of transparent regions and the inner perimeter of the ceramic ball grid array structure is less than 1.0 mm.

In yet another alternative embodiment, the invention provides a micro-electromechanical system package. The package comprises a first substrate, a micro-electromechanical system (MEMS) chip coupled to the first substrate, wherein the MEMS chip has a first surface area and an outer perimeter, a plurality of bond pads coupled to a peripheral portion of the first surface area, and a transparent cover coupled to an upper surface of the MEMS chip, wherein the transparent cover has a second surface area and an outer perimeter, the first surface area being larger than the second surface area, and at least one shelf region is formed by the difference in surface areas, the plurality of bond pads being coupled to the at least one shelf region. The package further comprises a ceramic ball grid array structure coupled to the at least one shelf region, the ceramic ball grid array structure having an annular structure in the form of a rectangle, the annular structure having a top surface, a first inner surface adjacent the top surface of the annular structure, a lower surface opposite the top surface and adjacent the first inner surface, a second inner surface adjacent the lower surface, and a plurality of bond balls spaced at predetermined intervals on the lower surface of the annular structure, wherein the second inner surface is located at a greater distance from top surface of the annular structure than the first inner surface and the second inner surface is recessed with respect to the first inner surface and an encapsulant located between the first inner surface of the ceramic ball grid array structure and the outer perimeter of the transparent cover, wherein the encapsulant hermetically seals the first inner surface of the ceramic ball grid array structure to the outer perimeter of the transparent cover.

In an additional embodiment, the invention provides a method of using a micro-electromechanical system package. The method comprises exposing an upper surface of the transparent cover to optical radiation, transmitting a first portion of the optical radiation through the transparent cover, and blocking a second portion of the optical radiation using the structure of the ceramic ball grid array. The method also comprises reflecting the first portion of the optical radiation transmitted through the transparent cover off a plurality of MEMS components present on the MEMS chip, transmitting a third portion of the optical radiation through the transparent cover, and blocking a fourth portion of the optical radiation using the structure of the ball grid array.

Many benefits are achieved by way of the present invention over conventional techniques. For example, the present technique provides an easy to use process that relies upon conventional technology. In some embodiments, the method provides higher device yields. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

These and other objects and features of the present invention and the manner of obtaining them will become apparent to those skilled in the art, and the invention itself will be best understood by reference to the following detailed description read in conjunction with the accompanying drawings.

DETAILED DESCRIPTION OF THE INVENTION

This present invention relates generally to manufacturing objects. More particularly, the invention provides a method and apparatus for packaging a MEMS. Merely by way of example, the invention has been applied to a MEMS with a transparent glass cover bonded to a ball grid array with a reduced lateral separation between the transparent glass cover and the ball grid array. The method and apparatus can be applied to display technology as well as, for example, charge coupled display camera arrays, and infrared arrays.

FIGS. 3A–3D are simplified diagrams of a wafer-level hermetically sealed package according to embodiments of the present invention. These diagrams illustrate examples according to specific embodiments. One of ordinary skill in the art would recognize various modifications, alternatives and variations. Preferably, formation of the package occurs prior to separation of the active devices into die form. Here, separation often occurs using a dicing and/or scribing and breaking process, among others. Additional details of the present method are provided throughout the present specification and more particularly below.

Figure 3A:
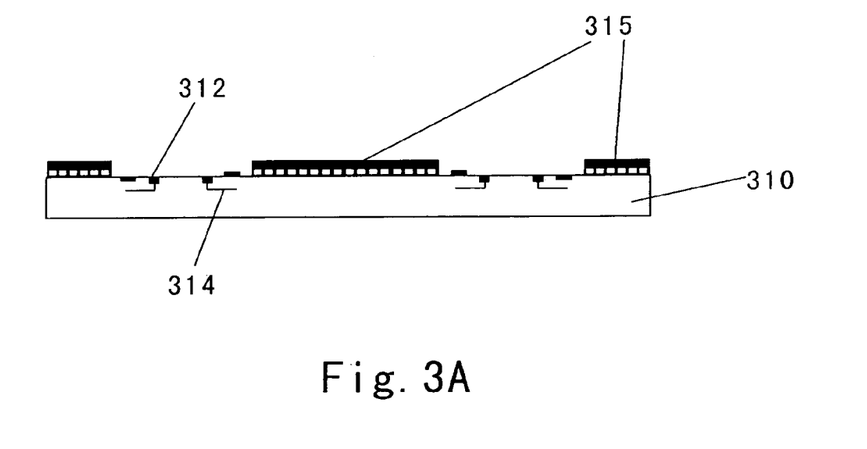
FIGS. 3A–3D are simplified diagrams of a wafer-level hermetically sealed package according to an embodiment of the present invention.

In the embodiment illustrated in FIG. 3A, a substrate 310 is processed according to methods to form an array of individual chips 315 on a substrate. In an embodiment according to the present invention, the substrate 310 is a CMOS semiconductor wafer, for example, Si, and the chips 315 are MEMS. An example of one way of forming these MEMS is described in U.S. Patent Application Ser. No. 60/390,389, commonly owned, and hereby incorporated by reference for all purposes. In the embodiment illustrated in FIG. 3A, the chips include a plurality of devices. Additionally, the CMOS wafer is processed to form integrated circuits 312, metal traces for electrical leads 314, and other CMOS structures. In an embodiment according to the present invention, the devices are micro-mirrors arranged in a multi-dimensional array, e.g., two-dimensional array. In alternative embodiments, the plurality of devices comprise a plurality of charge coupled devices (CCD), a plurality of deflection devices, a plurality of sensing devices, an integrated circuit device, any combination of these, and the like.

Figure 3B:
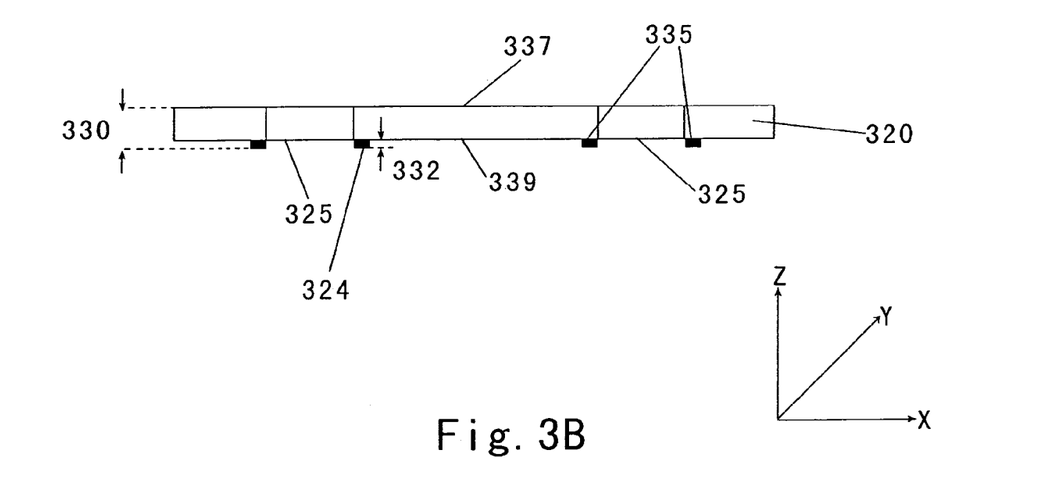

In the embodiment illustrated in FIG. 3B, a transparent member 320 is provided that includes a plurality of recessed regions 325 in the lower surface of the transparent member. The transparent member has a predetermined thickness 330. In an embodiment according to the present invention, the thickness of the transparent member is 1.2 mm. Alternatively, the thickness ranges from about 0.5 mm to about 3 mm in other embodiments. Of course, the thickness will depend upon the particular applications.

Preferably, the recessed region is a volume defined within a member. The volume has a depth 332 defined by the distance from the bottom of the transparent member 324 to the top of the recessed region 339. The outer edges of the recessed region are defined by the vertical edges of standoffs 335. In an embodiment according to the present invention, the volume of the recessed regions is uniform across the transparent member.

According to an embodiment of the present invention, the individual standoffs 335 comprise an annular rectangular ring with height 332 oriented in a plane parallel to the x-y plane. The lower surface of the standoff is prepared, in an embodiment according to the present invention, to mate to the substrate and form a bond sufficient to form a hermetically sealed package, as is discussed in detail below.

In embodiments according to the present invention, the depth of the recessed region is a predetermined depth. In the embodiment illustrated in FIG. 3B, the depth 332 of the recessed regions is 0.5 mm. Alternatively, the depth ranges from about 0.1 mm to about 1 mm in other embodiments. Of course, the depth of the recessed region will depend on the particular applications. Additionally, in embodiments according to the present invention, the area of the individual recessed regions will be a predetermined size. In the embodiment illustrated in FIG. 3B, the area of the individual recessed regions is about 14 mm×18 mm. Depending on the specific applications, this area may vary in size.

The recessed regions formed in the transparent member are arranged in a spatial manner to form a multi-dimensional array in the x-y plane. In some embodiments according to the present invention, the recessed regions are arranged to form a two-dimensional array in the x-y plane. In the embodiment illustrated in FIGS. 3A–3D, the depth and the x-y dimensions of the recessed regions 325 are greater than the height and the x-y dimensions of the chips 315. Accordingly, the chips fit within the recessed regions and the edges of the recessed regions are separated from the outer edges of the chips in all three dimensions. Moreover, in the embodiment illustrated in FIGS. 3A and 3B, the center-to-center spacing of the recessed regions in both the x and y dimensions exceeds the size of the recessed regions in both the x and y dimensions, respectively, providing space for the standoff regions 335 between adjacent chips. The lateral dimension of the standoff regions have a predetermined size. In an embodiment according to the present invention the lateral dimension of the standoff region ranges between 0.5 mm and 1.0 mm.

In an embodiment according to the present invention, the transparent member is formed from a product sold under the name of Corning Eagle$^{2000}$ display grade glass substrate manufactured by Corning Incorporated of Corning, N.Y. The glass substrate is characterized by high optical quality, including, but not limited to, optical power transmittance in the visible region of greater than 90%. The transmittance of light through the member can be increased by the application of anti-reflection (AR) coatings to the optical surfaces of the substrate, as disclosed below. Additionally, Corning Eagle$^{2000}$ display grade glass is used in some embodiments according to the present invention because the coefficient of thermal expansion of the glass substrate is close to the coefficient of thermal expansion of Si.

For a material, by definition, the thermal strain at temperature T is the change in length of a member, due to a change in temperature, $(T-T_{ref})$, divided by the original length l of that member. Denoting thermal strain at temperature T as $e_T(T)$, $$e_T(T) = \frac{\Delta l_{thermal}}{l}. \quad (1)$$

Also, by definition, the coefficient of thermal expansion for a material, denoted as (T) is, $$\alpha(T) = \frac{de_T}{dT}. \quad (2)$$

In embodiments according to the present invention in which temperature variation as a function of time is expected, it is useful to match the coefficient of thermal expansion (CTE) of the transparent cover to the CTE of the substrate. The matching of these CTEs limits the amount of warping and stress introduced in the substrate due to temperature variation.

In the embodiment illustrated in FIGS. 3A–3D, the transparent member is designed and fabricated to reduce optical absorption and thereby increase the transmission of optical energy at the wavelength range of interest. In an embodiment according to the present invention, the wavelength range of interest is the visible spectrum between 400 and 700 nm. Additionally, in this embodiment, the top surface of the member 337 and the top surface of the recessed regions 339 are polished or finished to provide optical quality surfaces. Moreover, AR coatings may be applied to the top surface of the transparent member and the top surface of the recessed regions. The AR coatings applied to the top surface of the transparent member will reduce the amount of light reflected off the top of the transparent member as it impinges on the package and thereby increase the amount of light that reaches the micro-mirror array 315. Moreover, AR coatings applied to the top of the recessed regions will reduce the amount of light reflected off the transparent member as it leaves the package. Overall system throughput will be increased by the use of these AR coatings. Quarter wave ($\lambda/4$) coatings of $MgF_2$ or other suitable dielectric materials can be used to form broadband AR coatings. For example, a $\lambda/4$ $MgF_2$ coating centered at 550 nm (with an index of refraction of 1.38 at 550 nm) deposited on a Corning Eagle$^{2000}$ display grade glass substrate, results in a power reflectance less than 2% per surface across the visible spectrum (400–700 nm).

The transparent member can be worked to form the recessed regions in a variety of ways. For example, in one embodiment according to the present invention, the recessed regions can be etched into the transparent member by the use of dry or wet chemical etching, laser machining, acoustic machining, water jet machining, or the like.

Figure 4A:
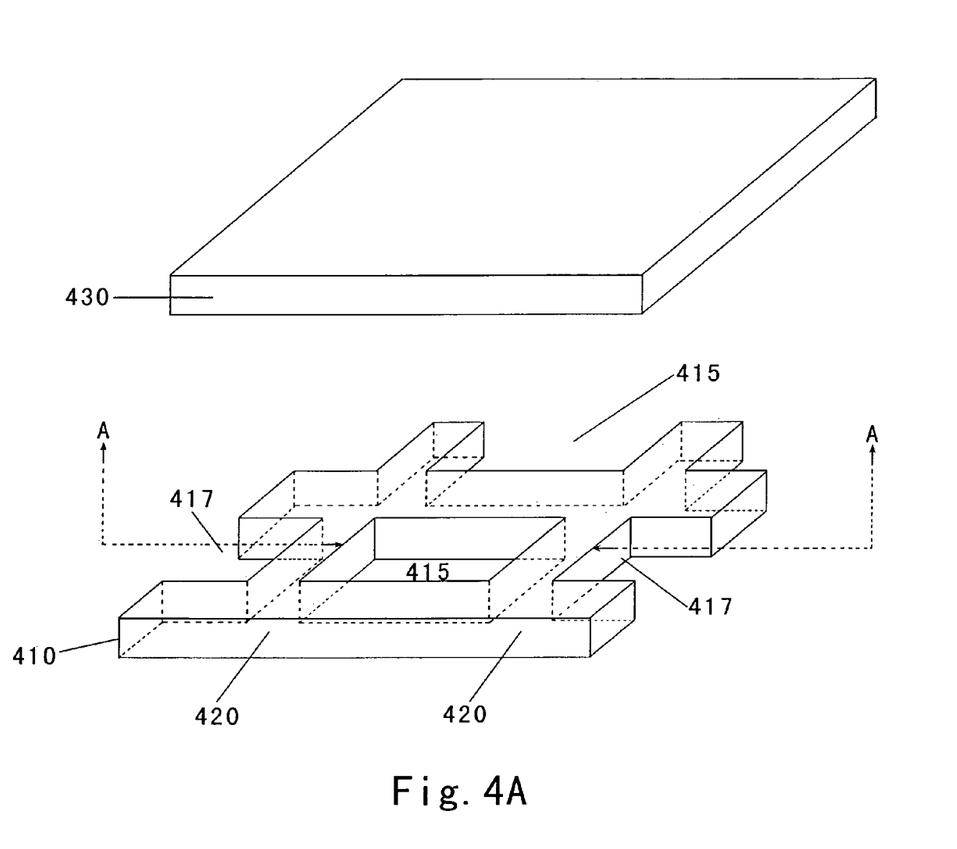
FIGS. 4A and 4B are simplified diagrams of a transparent member according to an embodiment of the present invention formed from two transparent components.
Figure 4B:
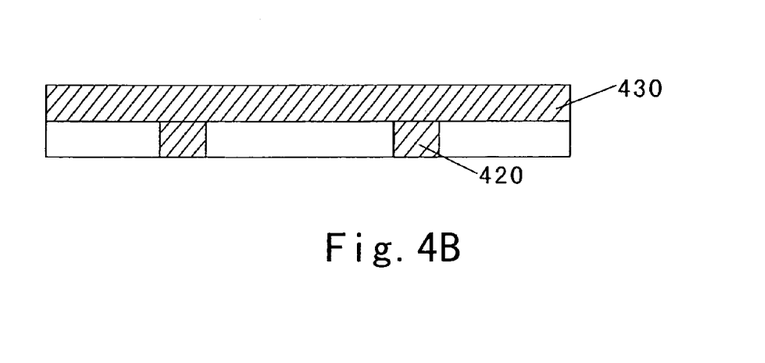

In an alternative embodiment according to the present invention, the transparent member is formed by machining a first planar component and subsequently bonding a separate transparent component to the first component as illustrated in FIG. 4. The first planar component 410 is a planar substrate that is machined or otherwise worked to form openings at locations in which recessed regions 415 are to be positioned. Additional openings are formed at positions 417 to form through holes used for attachment of wire bonds to the chip interconnect region, as will be described below. Unmachined areas of the first planar component will form the standoff regions 420. A second, planar transparent component 430 is bonded to the top of the first planar component to form the completed transparent member. In a specific embodiment according to the present invention, the first planar component and the second planar transparent component are both transparent. A side view of the completed transparent member taken along the plane A—A of FIG. 4A is illustrated in FIG. 4B. As illustrated in FIG. 4B, the standoff regions 420 and the top transparent component 430 are illustrated.

One of the benefits provided by this alternative fabrication process is that the optical properties of the two components are not always similar. In fact, for some applications, the optical properties of the first component illustrated in FIGS. 4A and 4B do not impact system performance. For example, depending on the optical path through the package, light may never impinge on the first component. In other embodiments according to the present invention, it is desirable to absorb any light that does impinge on the lower component.

In an embodiment according to the present invention, the optical properties of the transparent member are predetermined. In a specific embodiment, the transmittance and absorption coefficient of the transparent member are uniform as a function of position in the x-y plane.

In an embodiment according to the present invention, the bonding of the two transparent components is accomplished by low temperature glass frit bonding or other methods known to those of skill in the art. Additionally, AR coatings are applied to the top and bottom of the second transparent component prior to bonding to increase optical throughput. As discussed above, in this embodiment according to the present invention, the optical quality of the second transparent member will control the optical quality of light passing through the top of the recessed regions, enabling the use of polishing and coating methods not applicable to embodiments in which the transparent member is formed from a single substrate.

Figure 3C:
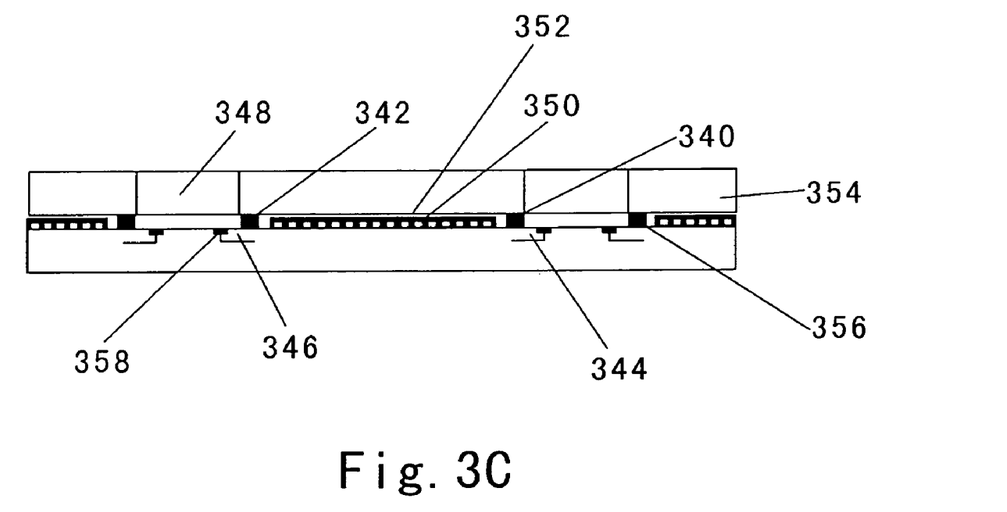

In an embodiment according to the present invention, hermetically sealed die-level packages are formed by coupling the transparent member to the substrate. FIG. 3C is a simplified diagram of the transparent member and the substrate at the time of hermetic sealing. The transparent member is aligned in a manner to position the standoff regions 340 and 342 above the street regions 344 and 346. The individual chips 350 are located below and in communication with an associated recessed region 352 and hermetically sealed by the transparent cover 354 at contact points 356 located at the base of the standoff regions 342. Through holes 348 provide access to bond pads 358 located on the CMOS wafer.

Hermetic sealing of the transparent member to the substrate is performed according to several methods well known to those skilled in the art. For example, in an embodiment according to the present invention, hermetic sealing is performed by plasma activated covalent wafer bonding (PACWB). PACWB is performed at room temperature after the substrate and transparent member have been cleaned, for example, in SC1 ($NH_3:H_2O_2:H_2O$, 1:4:20) at 60° C., rinsed in de-ionized (DI) water, dipped in 2% HF for 20 seconds, rinsed in DI water and dried with $N_2$ or air. The substrate and transparent member are then exposed, for example, to an oxygen plasma in a reactive ion etcher at a chamber pressure of about 35 mTorr. In an alternative embodiment according to the present invention, the substrate and transparent member are exposed to an argon plasma. After plasma treatment, the surface of the silicon oxide is hydrophilic, promoting bonding. The substrate and the transparent member are brought into contact at room temperature in a preselected ambient environment. In alternative embodiments according to the present invention, other bonding techniques are used, for example, eutectic low temperature bonding and anodic bonding.

In an embodiment according to the present invention, the hermetic sealing process illustrated in FIG. 3C is performed in an environment comprising inert gases. Examples of inert gases are $N_2$ and Ar, among others. The benefits provided by hermetic sealing in an inert environment include, but are not limited to dampening of oscillations present in the devices and the prevention of electrical arcing. For example, if the devices are micro-mirrors arranged in an array, oscillations present during operation and motion of the micro-mirrors are damped and attenuated by the presence of the inert gas. Additionally, the possibility of electrical arcing between the elements of the micro-mirror array and/or the drive electronics is reduced by the presence of the inert gas.

Figure 5A:
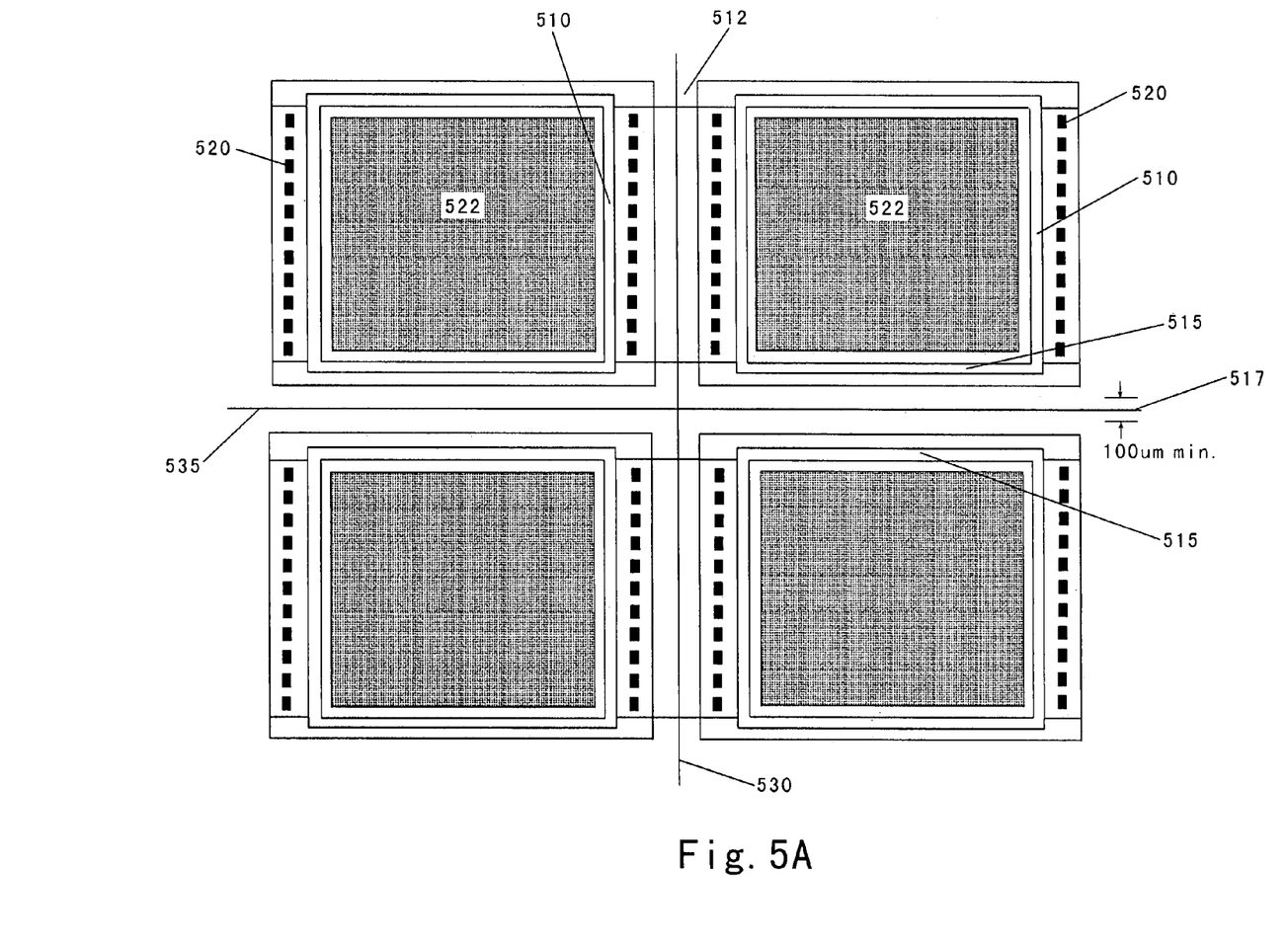
FIG. 5A is a simplified top view of a transparent member and substrate according to an embodiment of the present invention at the time of hermetic sealing.

FIG. 5A is a top-view of the device illustrated in FIG. 3C at the time of hermetic sealing. The standoff regions 510 running in the y-direction are located above the parallel street regions 512 and the standoff regions 515 running in the x-direction are located above the parallel street regions 517. Bond pads 520 are located at the right and left sides of the active devices 522. As illustrated in FIG. 3C, through holes 348 in the transparent member provide access to the bond pads.

Figure 5B:
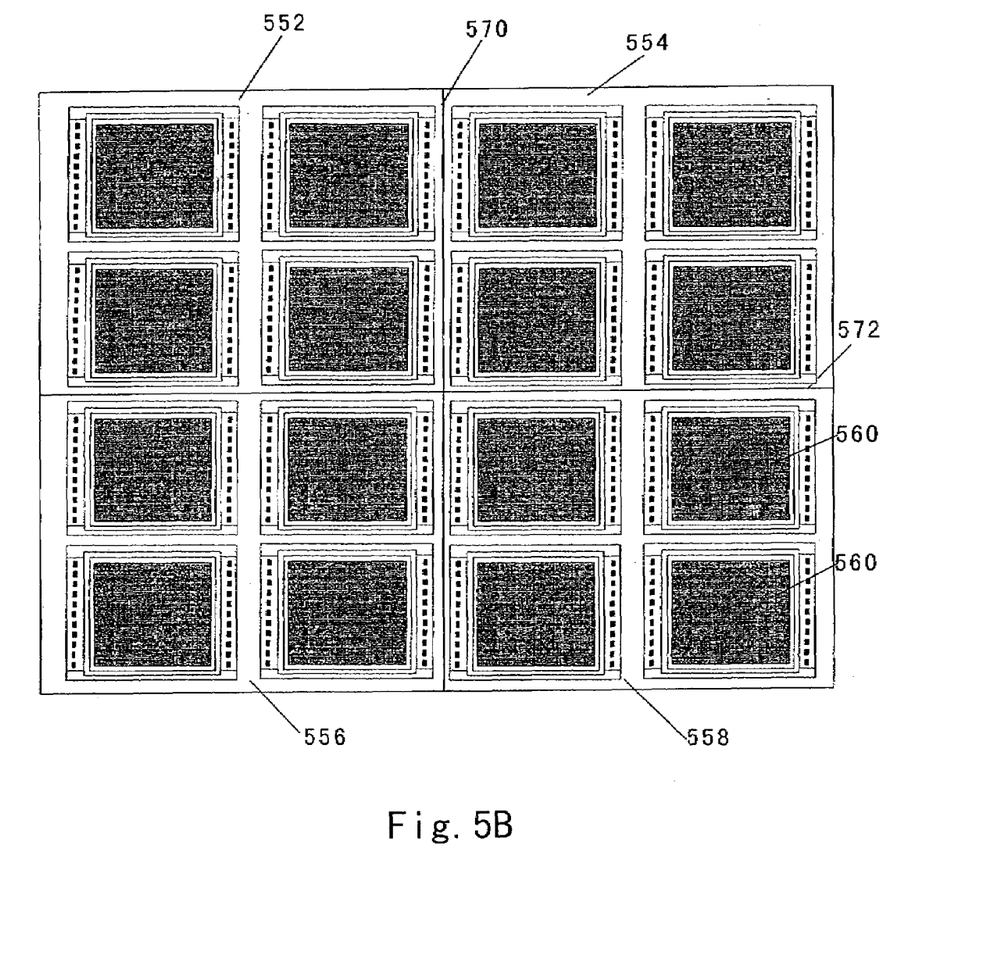
FIG. 5B is a simplified diagram of four transparent members and a substrate according to an alternative embodiment of the present invention at the time of hermetic sealing.

In an embodiment according to the present invention, the hermetic sealing process is performed by bonding a single transparent member to a single substrate. In this embodiment, the size of the single transparent member is selected to correspond to the size of the substrate. For example, a transparent member approximately 30 cm in width and length is bonded to a substrate 30 cm in diameter. Alternatively, the transparent member may be rectangular and larger in size than the substrate. In an alternative embodiment according to the present invention, the size of the transparent substrate is only a fraction of the substrate size. In this alternative embodiment, before hermetic sealing, multiple transparent members are arranged to align with matched areas on the substrate surface. The multiple transparent members are subsequently bonded to the substrate. For example, FIG. 5B illustrates a simplified diagram of four transparent members 552, 554, 556, and 558 arranged in a two-dimensional array above an array of chips 560 located on the substrate. In the alternative embodiment illustrated in FIG. 5B, the transparent members are manufactured so that adjacent transparent members abut each other at planes 570 and 572. However, this is not necessary. Additional alternative embodiments according to the present invention may align the transparent members differently.

Figure 3D:
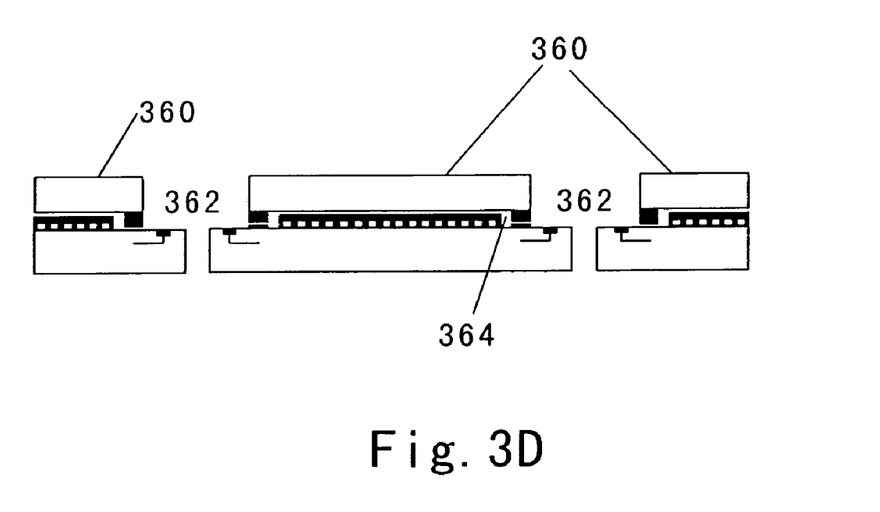

FIG. 3D illustrates, according to an embodiment of the present invention, the separation of individual dies after hermetic sealing is completed. In the embodiment illustrated in FIG. 3D, the individual dies 360 are separated along lines running in the y-direction located between adjacent bond pads. In the x-direction, the dies are separated to align the plane of separation with the through holes 362 located in the transparent member outside of the recessed region 364. For comparison, the lines in the y-direction and x-direction are illustrated in FIG. 5A as lines 530 and 535, respectively.

In a specific embodiment according to the present invention, the individual dies are separated by cutting the substrate into dies using a diamond saw. In an alternative embodiment, the dies are separated by scribing the substrate using a diamond scribe. In an embodiment of the invention in which the substrate is a silicon wafer, the die separation is performed by sawing the silicon substrate with a rotating circular abrasive saw blade.

Figure 6:
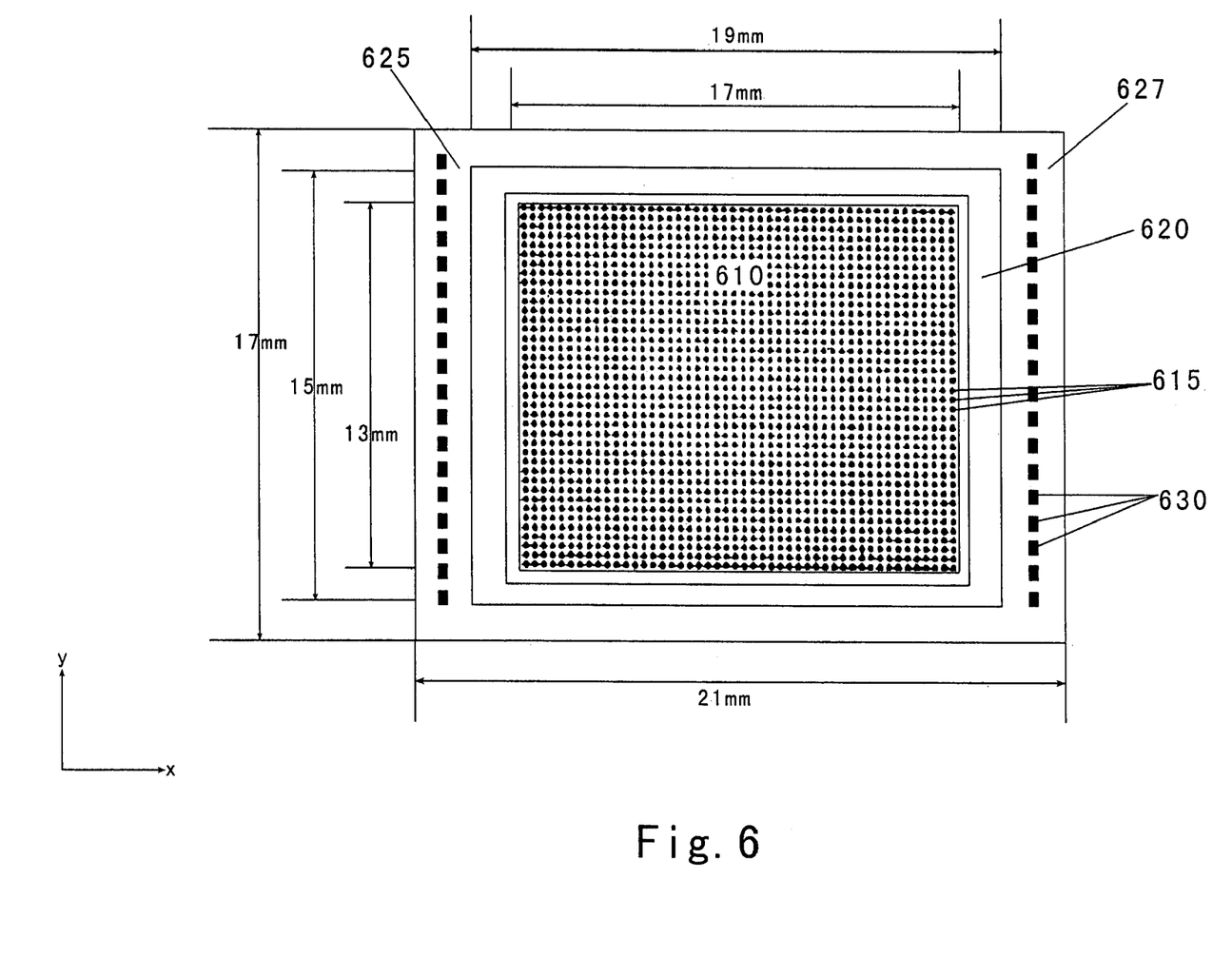
FIG. 6 is a simplified diagram of a single micro-mirror chip after hermetic sealing according to an embodiment of the present invention.

FIG. 6 is a top-view of a single die according to an embodiment of the present invention. The lateral dimensions of the chip and recessed region are predetermined sizes. In the embodiment illustrated in FIG. 6, the lateral dimensions of the chip 610 is about 17 mm by 13 mm. The center to center spacing of the chip is about 21 mm in the x-direction and 17 mm in the y-direction. The chip in this specific embodiment comprises a 1024×768 array of micro-mirrors 615. The edges of the micro-mirrors are separated from the standoff regions 620 in the x and y directions by a distance of 0.5 mm. The standoff regions are 0.5 mm in width. Through holes 625 and 627 to the left and right of the standoff regions, respectively, provide access to bond pads 630 100 m in size and set on a 150 m pitch. Alternatively, the center to center spacing of the chip 610 is 16 mm×12 mm, resulting in a separation between the chip and the standoff regions of 0.25 mm. Of course, these dimensions will depend upon the particular applications.

In an embodiment according to the present invention, the surface roughness of the standoff regions that come in contact with the substrate is reduced to a predetermined level. An Atomic Force Microscopy (AFM) is typically used to characterize the surface roughness of the lower surface of the standoff region. For example, a Digital Instruments EnviroScope from Veeco Instruments, Inc. can be used.

For example, in a specific embodiment according to the present invention, the root mean square surface roughness of the lower surface of the standoff regions is less than or equal to 2 Å for a 2 m by 2 m area. In alternative embodiments according to the present invention, the surface roughness is about 3 Å RMS over a 2 m by 2 m area.

Figure 7:
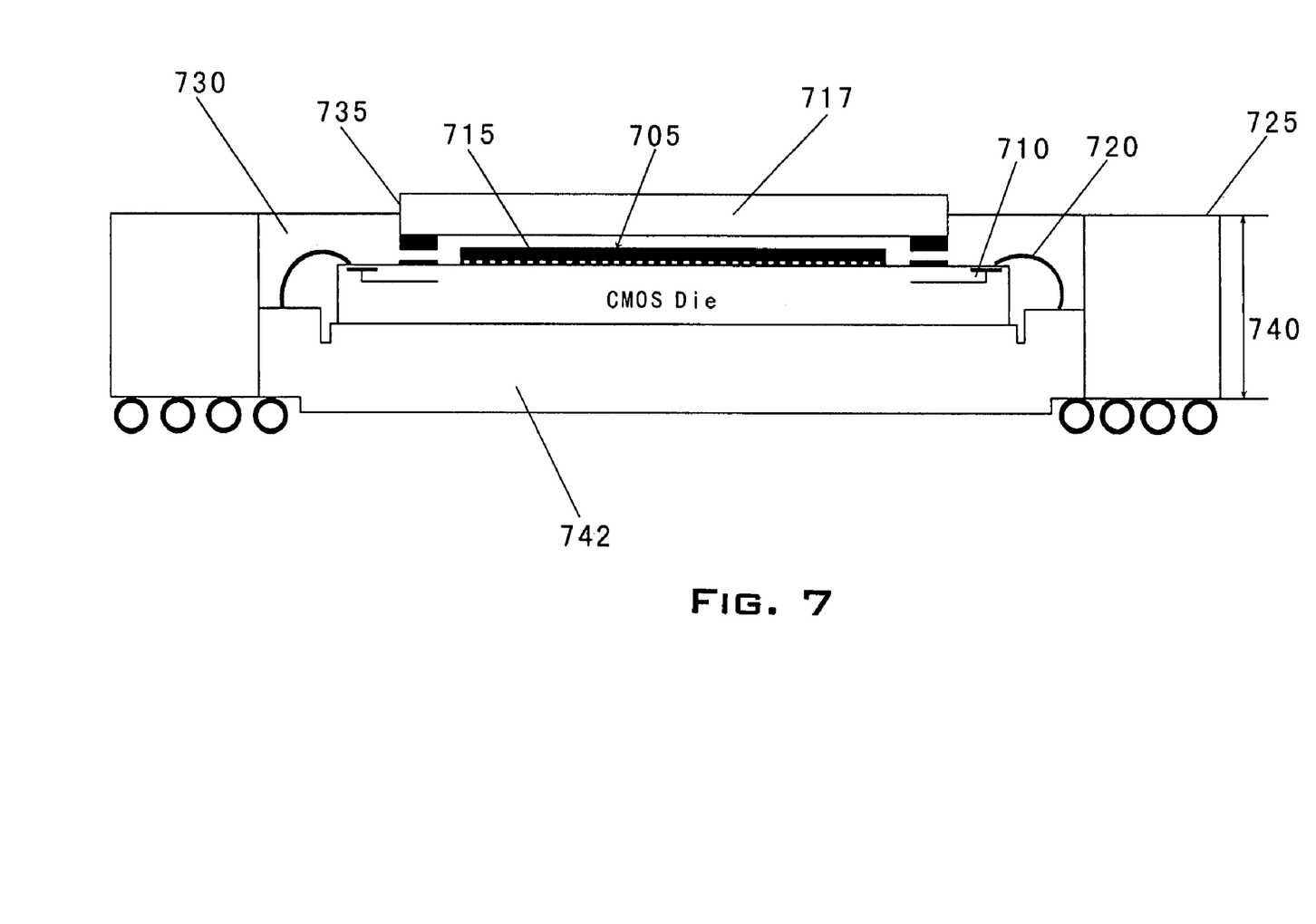
FIG. 7 is a simplified diagram of a die level package including a hermetically sealed die according to an embodiment of the present invention.

FIG. 7 is a simplified diagram of a die level package useful for making electrical connection to a hermetically sealed package and mounting the package according to an embodiment of the present invention.

FIG. 7 illustrates an embodiment according to the present invention in which the hermetically sealed package is mounted on a lead frame structure, such as a ball grid array. The separated CMOS die, chip, and hermetically sealed package previously described are illustrated as 705. In an embodiment according to the present invention, at least one interconnect region is associated with each chip on the substrate. In the embodiment illustrated in FIG. 7, the interconnect region or bonding pads 710 are located, for example, on or near the top surface of the wafer. In an embodiment according to the present invention, the interconnect pads are electrically connected to the plurality of devices to actuate the mechanical devices according to a MEMS algorithm. Thus, electrical signals presented at the interconnect region 710 result in mechanical motion of the devices 715. As disclosed previously, in a specific embodiment according to the present invention, the electrical signals presented at the interconnect region 710 deflect some or all of the micro-mirrors present in the micro-mirror array to preferentially reflect light passing through the transparent member 717 and incident on the micro-mirror array.

In order to electrically connect the interconnect region (and thus the devices) to external drivers, wire bonds 720 are connected from the interconnect pads 710 to electrical connections located on the lead frame structure 725. In an embodiment according to the present invention, the wire bonds are made using Au wires about 25 μm in diameter, which are capable of carrying in excess of 500 mA of current. In the embodiment according to the present invention illustrated in FIG. 7, the wire bonds are encapsulated in encapsulant 730. The use of encapsulants, for example, plastic, to protect electrical components from environmental damage is well known to those skilled in the art. The lead frame, in some embodiments, is brazed onto a heat spreader 742 to reduce the thermal load on the hermetically sealed package.

In some embodiments as illustrated in FIG. 7, the transparent cover 717 limits the freedom of movement of the capillary used during wire bonding of the bond wires to the bond pads 710. Due to the physical dimensions of the capillary used during wire bonding, which typically surrounds the bond wire, the presence of surface 735 located above and adjacent to the bond pads 710, results in a minimum lateral clearance between the outer edge 735 of the transparent cover and the location of the bond pads 710. Contact between the capillary and surface 735 may result in damage to the capillary and/or damage to the transparent cover. Additionally, the bond strength of the wire bond may be weakened if there is contact between the capillary and surface 735 during the wire bonding process. Therefore, typically, the bond pads are located at a predetermined minimum distance from the surface 735.

For example, in some embodiments, to prevent contact between the capillary and surface 735, which has a step height of 1 mm, a lateral clearance of 1 mm is provided on the sides of the MEMS chip on which bonding pads are located. In embodiments according to the present invention, the product of the lateral clearance and the dimension of the MEMS chip running into the paper, referred to as the length of the MEMS, defines a lateral extension or shelf area. In some embodiments, the shelf area is present on multiple sides of the MEMS chip. Although the shelf area provides a location for the bonding pads, the shelf area is generally not usable for the MEMS components preferably located inside the hermetically sealed cap layer and may be unusable for other MEMS components. As a consequence, in some embodiments, the surface area of the shelf area used by the bonding pads is only a fraction of the total shelf area, resulting in less than optimal utilization of the MEMS substrate area. Generally, it is desirable to increase the utilization of the MEMS substrate area. Therefore, reduction of the lateral extension area is desirable in some embodiments of the present invention.

Figure 8:
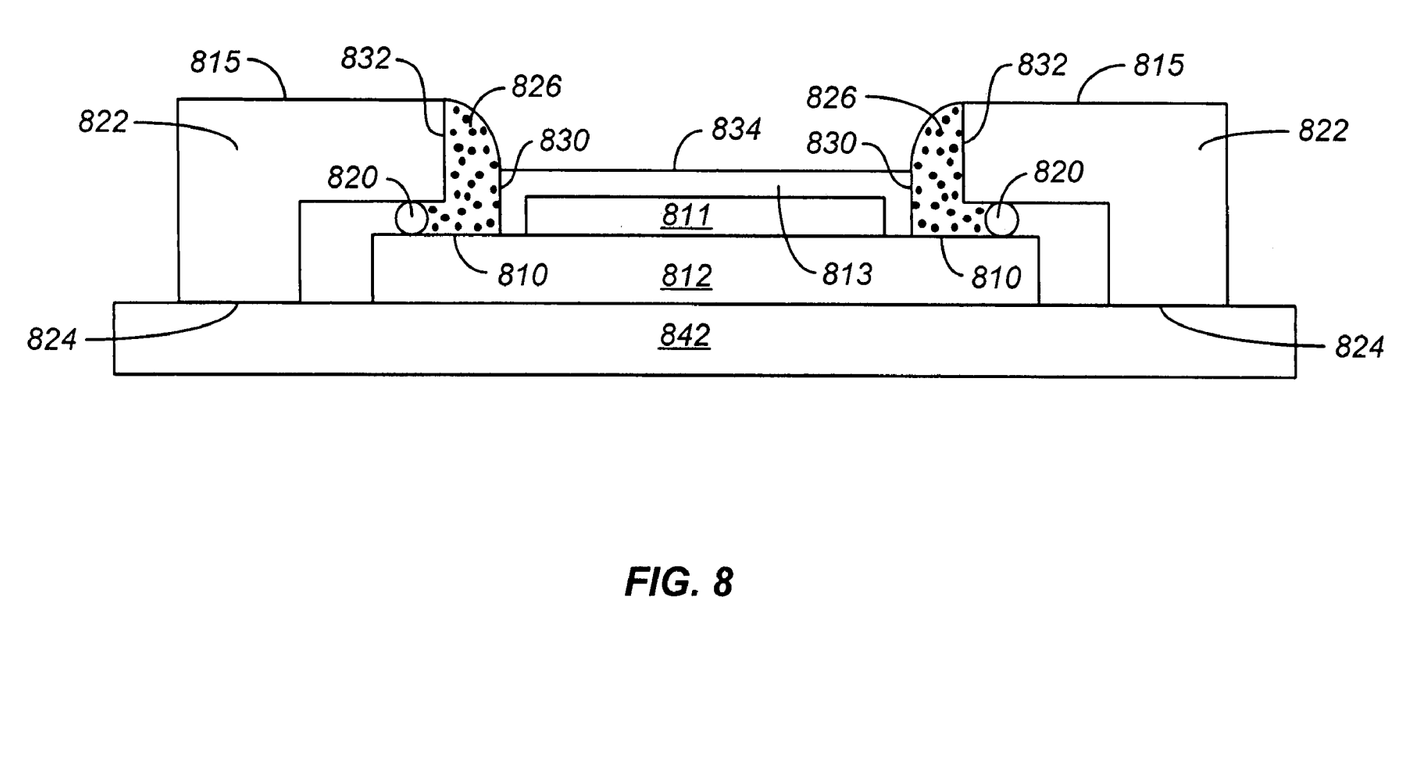
FIG. 8 is a simplified schematic diagram of a MEMS package according to an embodiment of the present invention.

FIG. 8 is a simplified schematic diagram of a MEMS package according to an embodiment of the present invention. As described above, a first wafer comprising MEMS components is hermetically sealed to a second wafer comprising transparent covers. The hermetically sealed structure forms a multi-substrate semiconductor structure. This multi-substrate semiconductor structure is subsequently diced to form multi-substrate semiconductor packages comprising MEMS chips. The hermetically sealed package, in some embodiments, is brazed onto a heat spreader 842 to reduce the thermal load on the hermetically sealed package.

As illustrated in FIG. 8, lateral extension portion or shelf 810 is located on peripheral regions of the MEMS chip 812.

As illustrated in FIG. 8, shelf 810 is present on two sides of the MEMS chip. Of course, in alternative embodiments according to the present invention, the lateral extension portion or shelf 810 is present on more than two sides, for example, four sides.

Multi-layer ceramic ball grid array (BGA) mounting assembly 815 surrounds and is coupled to the MEMS chip. Ceramic BGA mounting assembly 815 comprises solder balls 820, a multi-layer ceramic substrate support assembly 822 and base 824. Encapsulant 826 provides a seal between the periphery of the MEMS chip and the inner surfaces of the ceramic BGA mounting assembly. Electrical contact between the base of the ceramic BGA mounting assembly and the solder balls is provided by electrically isolated metal traces formed inside the multi-layer ceramic assembly. In one embodiment, metal traces are deposited on surfaces of the ceramic layers, which are bonded together. The metal traces are interconnected through vias between layers to provide isolated electrical connections between specific portions of the base and specific portions of the ceramic BGA assembly adjacent the solder balls.

In some embodiments, the solder balls are formed by depositing solder bumps on the MEMS chips. A metal seed layer is deposited on the upper surface of the MEMS chips and solder bumps are electroplated using the seed layer. Thermal reflow converts the solder bumps to solder balls as illustrated in FIG. 8. In alternative embodiments, the solder balls are formed by depositing solder bumps on the multi-layer ceramic BGA mounting assembly rather than the MEMS chips.

The solder balls illustrated in the schematic illustration of FIG. 3 are distributed in at least two dimensions. In a particular embodiment, the solder balls extend along a line running into the page, creating a linear arrangement of solder balls on top of shelf 810 an equal distance from surface 830. In an alternative embodiment, multiple solder balls are present on the shelf at a given location. For example, one embodiment uses two solder balls adjacent each other on the shelf and extending along two lines running into the page, forming two adjacent lines of solder balls. Solder balls in embodiments according to the present invention are formed to have predetermined dimensions and to be distributed at predetermined pitches. For example, a particular embodiment utilizes solder balls 100 μm in diameter with a pitch of 1 mm. Other embodiments utilize other sizes and pitches depending on the applications. Electrical contact between the traces on the ceramic BGA structure and external electrical devices is provided in means known to those of skill in the art.

In the embodiment illustrated in FIG. 8, the lateral dimension of shelf 810 is reduced from the value associated with the conventional package illustrated in FIG. 7. For example, in an embodiment according to the present invention, the lateral dimension of the shelf is a predetermined length. For example, the lateral dimension of the shelf in one embodiment is less than 1.0 mm. In an alternative embodiment, the lateral dimension of the shelf is less than 0.3 mm and in a particular embodiment, it is 0.2 mm. Of course, the dimensions will depend upon the particular applications. The reduction in shelf size results in an increase in the area of the MEMS substrate usable for MEMS components. Thus, for a given size of MEMS substrate, more usable MEMS devices can be produced, increasing yield per area and decreasing overall fabrication cost.

As illustrated in FIG. 8, the inner perimeter of the ball grid array structure is sealed to the outer perimeter of each of the plurality of transparent members by flowing an encapsulant into a region adjacent to the inner perimeter of the ball grid array structure. The use of encapsulants, for example, plastic, to protect electrical components from environmental damage is well known to those skilled in the art.

In FIG. 8, the encapsulant is applied to seal the gap between the inner edge 832 of the ceramic BGA and the outer edge 830 of the transparent member. The bond balls are encapsulated by the encapsulant, while maintaining a surface region 834 of the transparent member free from encapsulant. Thus, in this embodiment, the optical properties of the surface region 834 are unaffected by the application of the encapsulant. In alternative embodiments, a pre-selected portion of the transparent member is covered by encapsulant 826. For example, in a particular embodiment, the encapsulant extends to a maximum length of 0.3 mm from the outer perimeter of the transparent member.

As illustrated in FIG. 8, the MEMS chip comprises a multi-substrate semiconductor package. Embodiments of the present invention provide methods of manufacturing such multi-substrate semiconductor packages. Typically, the first substrate 812 contains a plurality of first dies present on the surface of the substrate. In particular embodiments, these dies are micro-mirror arrays, but this is not required by the present invention. Electrical contacts are often provided on the surface of the first substrate to provide electrical contact with the components of the dies. For example, electrical signals provided to individual mirrors in a micro-mirror array are routed through electrical contacts on the surface of the first substrate in an embodiment. As illustrated in FIG. 8, the electrical contacts are located on a lateral extension portion 810 around the periphery of the first substrate, but this is not required by the present invention. The electrical contacts are located at alternative positions in alternative embodiments.

A second substrate 813 is wafer bonded to the first substrate 812 using wafer bonding techniques as previously described to form a sandwich structure. As illustrated in FIG. 8, the second substrate contains a plurality of second dies. These dies include a recessed region 811 and interconnect regions located above lateral extension portion 810. In the embodiment according to the present invention shown in FIG. 8, the interconnect regions are through holes present in the second substrate, but this is not required by the present invention. Alternative embodiments utilize recessed regions of predetermined thickness and contact vias. After the substrates are bonded together as illustrated in FIG. 8, the lateral extension portion 810 is exposed from the top, as these lateral extension portions are adjacent the through hole interconnect regions present in the second substrate. The lateral extension portion forms an intermediate level intermediate level within the sandwich structure.

After wafer bonding, the dies are typically separated using dicing or sawing techniques as previously discussed. In FIG. 8, the size of the interconnect regions on the second substrate are sufficient to form the lateral extension portions at the intermediate level. The sandwich structure is coupled to a support structure 842 to provide mechanical rigidity to the package. In some embodiments, the support structure is a printed circuit board.

An electrically conductive structure is coupled to the sandwich structure through the interconnect regions of the second die, making electrical contact with the lateral extension portion. Thus, the electrically conductive structure is coupled to the lateral extension portion within a portion of the intermediate level. As shown in FIG. 8, a multi-layer ceramic BGA support structure 822 is coupled to the sandwich structure through the use of bond balls 820. The bond balls electrically coupled the contacts on the lateral extension portions to the contacts present in the multi-layer ceramic BGA support structure. Additional contacts are locations 824 provide additional electrical connectivity with external sources and loads, not shown.

Figure 9:
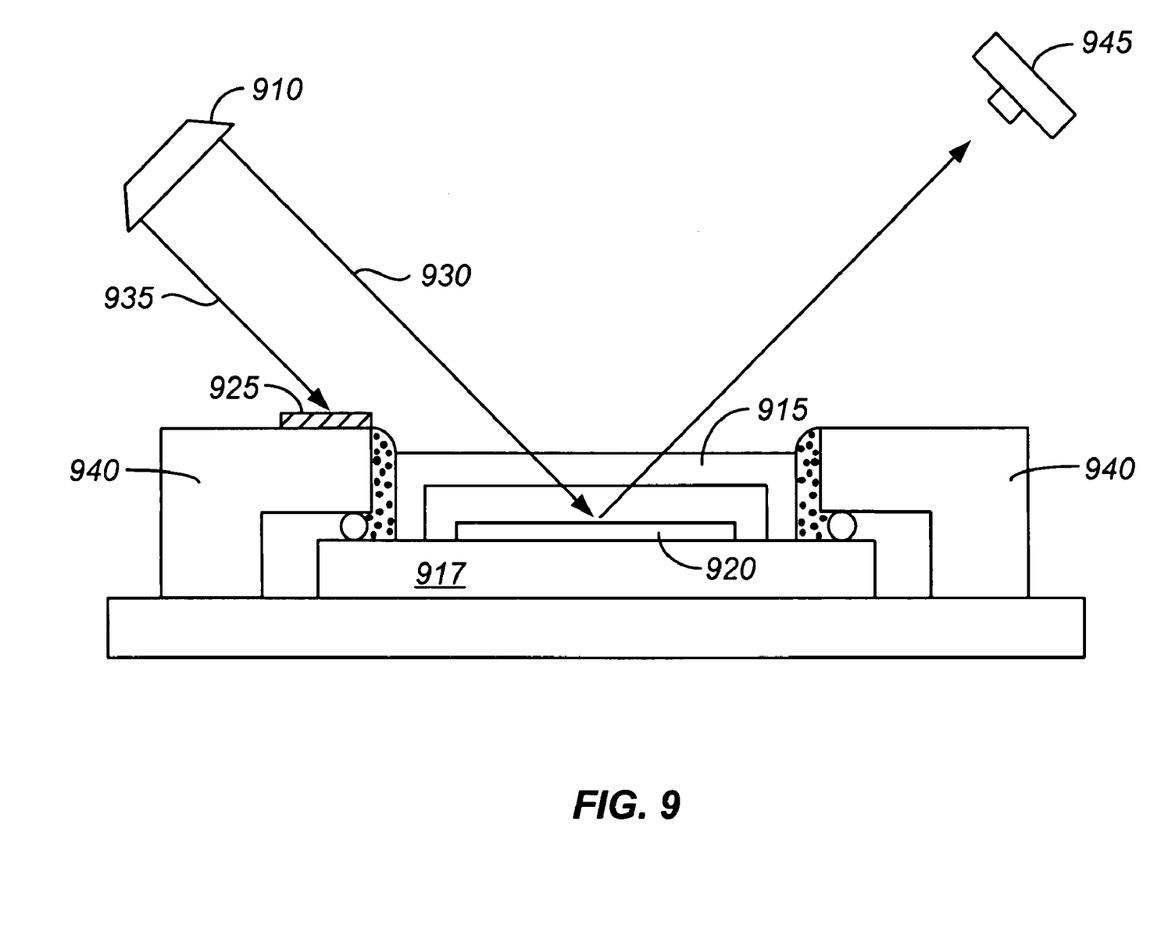
FIG. 9 is a simplified schematic diagram illustrating the operation of a reflective system employing a specific embodiment of the present invention.

FIG. 9 illustrates the operation of a reflective system employing a specific embodiment of the present invention. In embodiments according to the present invention, it is desirable to spatially filter light incident on and/or reflected from the package. In the embodiment illustrated in FIG. 9, a beam of light from a light source 910 is incident on the top surface of the multi-substrate semiconductor package. A portion of the light 930 passes through the transparent cover 915. The light 930 is incident on the surface of the MEMS chip 917, which in this embodiment, comprises a micro-mirror array 920. Another portion of the light 935 from the lamp 910 is blocked or filtered by filter mask 925 located on the left side of an upper surface of ceramic ball grid array support member 940. Light blocked by the filter mask 925 is not able to reach the micro-mirror array. Thus, by the use of filter mask 925, the reflected light passing to detector 945 is limited to a selected portion of the original beam that is incident on the package.

In alternative embodiments, filter masks are located on the transparent cover. In some of these alternative embodiments, a portion of the light generated by source 910 is blocked or filtered by filter masks located on an upper left surface of the transparent cover as the light propagates towards the micro-mirror array. In other alternative embodiments, light reflected off the micro-mirror array or portions of the MEMS chip other than the micro-mirror array is blocked by filter masks present on an upper right surface of the transparent cover. Thus, by the use of filter masks located on the upper surface of the transparent cover, the reflected light passing to detector 945 is limited to a selected portion of the original beam that is incident on the package.

In the embodiments discussed in relation to FIG. 9, filter masks are located either on the surface of the ceramic BGA structure or an upper surface of the transparent cover, however, this is not required. In alternative embodiments, filter masks are located on both structures and/or the lower surface or sides of the transparent cover. In an additional embodiment according to the present invention, the use of non-transparent materials in the fabrication of the transparent cover can complement the filter masks. In one embodiment, the filter masks comprise a layer of chrome. In alternative embodiments, the filter masks are made from other reflective or absorptive materials.

While the above is a complete description of specific embodiments of the invention, the above description should not be taken as limiting the scope of the invention as defined by the claims.

What is claimed is:

1. A micro-electromechanical system package, the package comprising:
   a first substrate;
   a micro-electromechanical system (MEMS) chip coupled to the first substrate, wherein the MEMS chip has a first surface area and an outer perimeter;
   a plurality of bond pads coupled to a peripheral portion of the first surface area;
   a transparent cover coupled to an upper surface of the MEMS chip, wherein the transparent cover has a second surface area and an outer perimeter, the first surface area being larger than the second surface area, and at least one shelf region is formed by the difference in surface areas, the plurality of bond pads being coupled to the at least one shelf region;
   a ceramic ball grid array structure coupled to the at least one shelf region, the ceramic ball grid array structure having an annular structure in the form of a rectangle, the annular structure having a top surface, a first inner surface adjacent the top surface of the annular structure, a lower surface opposite the top surface and adjacent the first inner surface, a second inner surface adjacent the lower surface, and a plurality of bond balls spaced at predetermined intervals on the lower surface of the annular structure, wherein the second inner surface is located at a greater distance from the top surface of the annular structure than the first inner surface and the second inner surface is recessed with respect to the first inner surface;
   an encapsulant located between the first inner surface of the ceramic ball grid array structure and an outer perimeter of the transparent cover, wherein the encapsulant hermetically seals the first inner surface of the ceramic ball grid array structure to the outer perimeter of the transparent cover.

2. The apparatus of claim 1 wherein the encapsulant extends to a maximum distance of 0.3 mm from the first inner surface of the ceramic ball grid array structure.

3. The apparatus of claim 1 wherein the ceramic ball grid array structure comprises a solder bearing material.

4. The apparatus of claim 1 wherein the MEMS chip comprises an array of micro-mirror devices.

* * * * *